(12) United States Patent
Lien et al.

(10) Patent No.: US 9,378,808 B2
(45) Date of Patent: Jun. 28, 2016

(54) PULSE WIDTH MODULATION DEVICE

(71) Applicant: M31 Technology Corporation, Hsinchu County (TW)

(72) Inventors: Nan-Chun Lien, Taipei (TW);
Chen-Wei Lin, Kaohsiung (TW);
Chao-Kuei Chung, Taichung (TW);
Li-Wei Chu, New Taipei (TW);
Yuh-Jiun Lin, Hsinchu (TW); Yu-Wei Yeh, Hsinchu (TW); Wei-Chiang Shih, Taipei (TW)

(73) Assignee: M31 Technology Corporation, Zhubei, Hsinchu County (TW)

( * ) Notice: Subject to any disclaimer, the term of this patent is extended or adjusted under 35 U.S.C. 154(b) by 0 days.

(21) Appl. No.: 14/603,818

(22) Filed: Jan. 23, 2015

(65) Prior Publication Data

US 2016/0111144 A1    Apr. 21, 2016

(30) Foreign Application Priority Data

Oct. 17, 2014  (TW) .............................. 103136020 A

(51) Int. Cl.
*G11C 11/419*         (2006.01)

(52) U.S. Cl.
CPC .................... *G11C 11/419* (2013.01)

(58) Field of Classification Search
CPC .............................. G11C 11/419; G11C 7/222
USPC ............................................. 365/154, 189.05
See application file for complete search history.

(56) References Cited

U.S. PATENT DOCUMENTS

| 6,597,629 | B1 * | 7/2003 | Raszka | .................... G11C 8/08 |
| | | | | 365/154 |
| 6,777,712 | B2 * | 8/2004 | Sanford | ............... G09G 3/3233 |
| | | | | 257/59 |
| 8,045,402 | B2 | 10/2011 | Yeung | |
| 8,315,085 | B1 * | 11/2012 | Chang | .......................... 365/154 |

* cited by examiner

*Primary Examiner* — Michael Tran
(74) *Attorney, Agent, or Firm* — Winston Hsu; Scott Margo

(57) ABSTRACT

A pulse width modulation device for use in an N-ports random access memory having a plurality of word line sets, wherein a specified word line set comprises N port word lines. The pulse width modulation device comprises a status detecting device and a clock signal generator. The status detecting device is coupled to the N port word lines having a first and a second port word line, and outputs a first control signal when both the voltage values of the first and second port word lines are within a first level range. The clock signal generator is coupled to the status detecting device and the specified word line set, and generates and outputs a first clock signal to the specified word line set, wherein a duration of the first clock signal kept within the first level range is variable in response to the first control signal.

15 Claims, 6 Drawing Sheets

PULSE WIDTH MODULATION DEVICE

FIELD OF THE INVENTION

The present invention relates to a pulse width modulation device, and more particularly to a pulse width modulation device applicable to a multi-port random access memory.

BACKGROUND OF THE INVENTION

Refer to FIG. 1, which is a schematic circuit diagram of a conventional dual-port (i.e., 2-port) static random access memory (SRAM) unit. It is different from the single port static random access memory in that in addition to the latch unit 10 composed of four transistors, and a first switch set 11, the dual-port static random access memory further comprises a second switch set 12 which allows a peripheral reading/writing circuit (not shown) coupled to the memory to perform data reading from or data writing into the latch unit 10 and other latch unit in the same row (not shown) at the same time via a first port word line WLA and a second port word line WLB, respectively.

In order to provide a margin necessary for reading data from or writing data into different latch units in the same row at the same time, the conventional reading/writing circuit has to provide a large enough word line pulse width, and keep the selected word line at a high voltage level for a duration long enough to ensure that the data reading and writing can be done correctly even if the worst case occurs. However, this would result in the following drawbacks: firstly, too much power would be consumed; and, secondly, the long turn-on time of the word lines would increase the risk of affecting correctness of the stored data due to environment noises.

SUMMARY OF THE INVENTION

Therefore, one of the primary objects to develop the present application is to improve the technique drawbacks of a conventional dual-port/2-port static random access memory and data reading/writing circuit thereof.

In one aspect, the present application provides a pulse width modulation device for use in an N-ports random access memory, N being greater than or equal to 2, the N-ports random access memory comprising a plurality of word line sets, at least a specified one of the word line sets comprising N port word lines, and the pulse width modulation device comprising: a status detecting device outputting a first control signal when both voltage values of a first port word line and a second port word line in the N port word lines are within a first level range; and a clock signal generator electrically coupled to the status detecting device and the specified word line set and generating and outputting a first clock signal to the specified word line set, wherein a duration of the first clock signal kept within the first level range is variable and controlled with the first control signal.

In another aspect, the present application provides a pulse width modulation device for use in a static random access memory, the static random access memory comprising a plurality of word line sets, at least a specified one of the word line sets comprising at least a first port word line and a second port word line, and the pulse width modulation device comprising: a status detecting device changing a basis for discharging from a first load value to a second load value when both voltage values of the first port word line and the second port word line are within a first level range; and a clock signal generator generating and sending a first clock signal to the specified word line set, wherein a duration of the first clock signal kept within the first level range is determined in accordance with at least a discharging duration of the first load value or a discharging duration of the second load value.

DETAILED DESCRIPTION OF PREFERRED EMBODIMENTS

Some typical embodiments illustrating features and advantages will be described in detail as follows. It should be understood that a variety of variations can be made on different embodiments of the present application and are within the scope of the present application. The descriptions and drawings made herein are substantially for explanation only and are not to make limitations on the present application.

Figure 2A:
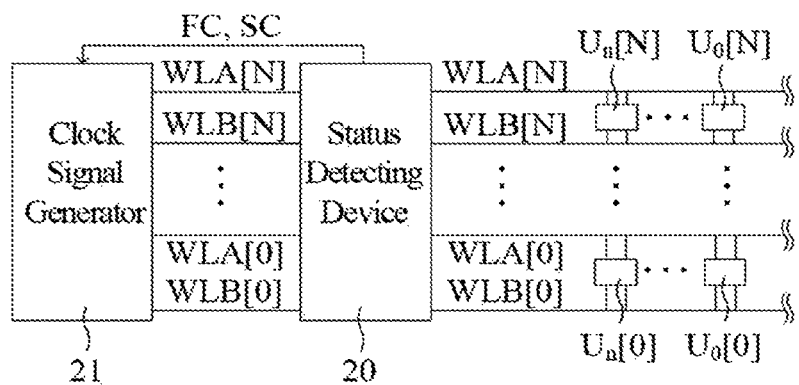
FIG. 2A is a block circuit diagram of a preferred embodiment of a pulse width modulation device developed by the present application.

Please refer to FIG. 2A, which is a block circuit diagram of a preferred embodiment of a pulse width modulation device developed by the present application, the embodiment is described by taking a static random access memory as an example, however, the present application can be widely applied and not limited to an N-port static random access memory or other similar N-port memory units, wherein N could be greater than or equal to 2. As shown in this figure, the embodiment is described by taking a dual-port static random access memory as an example. The dual-port static random access memory comprises a plurality of static random access memory unit $U_n[N], \ldots, U_0[N], \ldots, U_n[0], \ldots, U_0[0]$, and a plurality of word line sets, wherein each word line set comprises a first port word line and a second port word line such as WLA[N] and WLB[N], or WLA[0] and WLB[0] shown in this figure.

The pulse width modulation device developed by the present application primarily comprises a status detecting device 20 and a clock signal generator 21. The status detecting apparatus 20 is electrically coupled to the first port word lines WLA[N], ..., WLA[0] and the second port word lines WLB [N], ..., WLB [0], outputs a first control signal FC when the voltage values of the first port word line and the second port word line of the same word line set are both within a first level range, and, on the other hand, outputs a second control signal SC when the voltage values of the first port word line and the second port word line of the same word line set are not both within the first level range. The clock signal generator 21 electrically coupled to the status detecting device 20 generates and outputs a clock signal to the word line sets, wherein a duration of the clock signal kept within the first level range can be changed in response to the control signals FC and SC, for example, the pulse width of the clock signal of the word line being different in response to whether voltage values of the first port word line and the second port word line of the same word line set are both within the first level range.

Figure 2B:
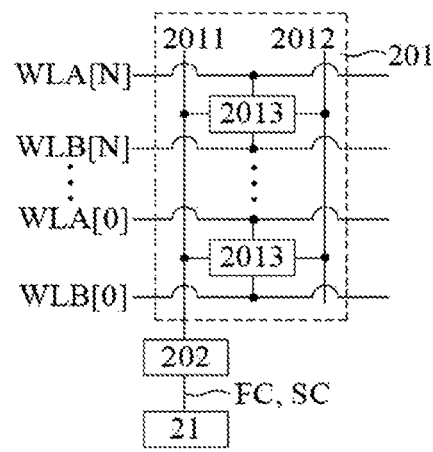
FIG. 2B is a block circuit diagram of a preferred embodiment of a status detecting device.

Please refer to FIG. 2B, which is a block circuit diagram of a preferred embodiment of the above mentioned status detecting device 20. The status detecting device 20 primarily comprises an electrical load 201 with a changeable load value, and a control signal generator 202. The electrical load 201 is electrically coupled to the first port word lines WLA[N], . . . , WLA[0] and the second port word lines WLB[N], . . . , WLB[0], changes the load value from a first load value to a second load value in response to the voltage values of the first port word line and the second port word line of the same word line set being both within the first level range, and, on the other hand, maintains the load value of the electric load 201 at the first load value when the voltage values of the first port word line and the second port word line of the same word line set are not both within the first level range. For example, as shown in this figure, the electrical load 201 comprises a first load conductor 2011, a second load conductor 2012 and a controlled switch device 2013. The controlled switch device 2013 is electrically coupled to the first port word lines WLA[N], . . . , WLA[0], the second port word lines WLB[N], . . . , WLB[0], the first load conductor 2011 and the second load conductor 2012, switches to electrically connect the first load conductor 2011 to the second load conductor 2012 in response to the voltage values of the first port word line and the second port word line of the same word line set being both within the first level range so that the load value of the electrical load 201 is changed to the second load value having a bigger value from the first load value having a smaller value, and, on the other hand, switches to disconnect the first load conductor 2011 from the second load conductor 2012 when the voltage values of the first port word line and the second port word line of the same word line set are not both within the first level range so that the load value of the electrical load 201 is maintained at the first load value having smaller value. Furthermore, the load values of the first load conductor 2011 and the second load conductor 2012 are near an equivalent load value of a bit line in the random access memory, wherein the load value could be a capacitance value, a resistance value or a combination of both. Preferably, the first load conductor 2011 and the second load conductor 2012 could be disposed parallel with the bit line in the random access memory, and a length or width thereof is similar to or in proportion to the length or width of the bit line so that the equivalent load value can be simulated.

Figure 2C:
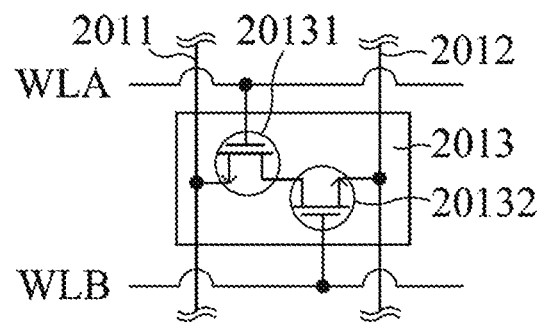
FIG. 2C is a block circuit diagram of an embodiment of a controlled switch device.

An embodiment of the controlled switch device 2013 described above could be formed by serially connecting a first metal oxide semiconductor transistor 20131 and a second metal oxide semiconductor transistor 20132 as shown in FIG. 2C. A gate of the first metal oxide semiconductor transistor 20131 is electrically coupled to the first port word line WLA, and a source thereof is electrically coupled to the first load conductor 2011. A gate of the second metal oxide semiconductor transistor 20132 is electrically coupled to the second port word line WLB, a source thereof is electrically coupled to the second load conductor 2012, and a drain thereof is electrically coupled to a drain of the first metal oxide semiconductor transistor 20131.

Figure 1:
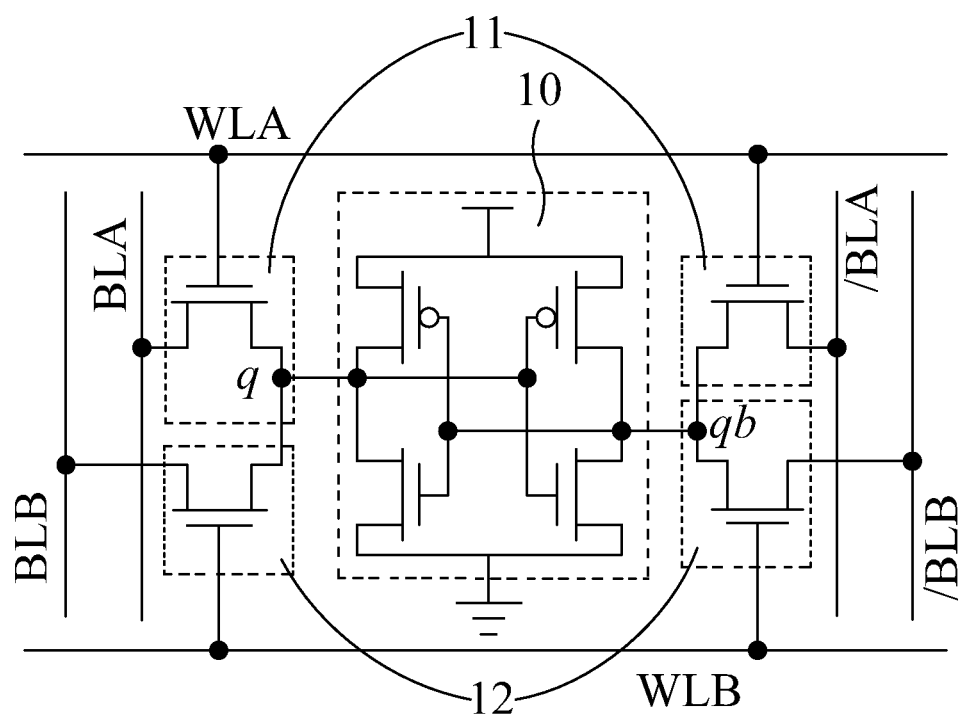
FIG. 1 is a schematic circuit diagram of a conventional dual-port static random access memory.
Figure 2D:
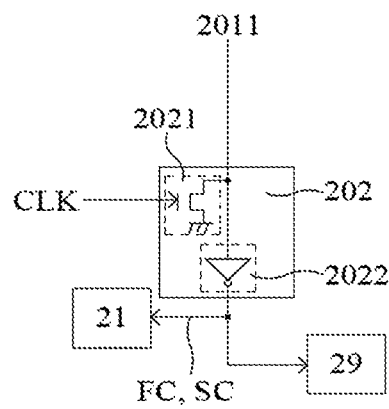
FIG. 2D is a block circuit diagram of an embodiment of a control signal generator.

As for the control signal generator 202 being electrically coupled to the electrical load 201, the first control signal FC is generated and outputted to the clock signal generator 21 in response to the occurrence of the first load value or the second control signal SC is generated and outputted to the clock signal generator 21 in response to the occurrence of the second load value, so that the duration of the clock signal kept within the first level range, with generated by the clock signal generator 21, could be changed in response to variation in the load value of the electrical load 201. For example, as shown in FIG. 2D, the control signal generator 202 may comprise a controlled discharge path 2021 and a voltage triggering unit 2022, the controlled discharging path 2021 is electrically coupled to the first load conductor 2011 in the electrically load 201 for conducting a discharging operation of the electrical load 201 therethrough during a specific period of time so as to lower the voltage value of the electrical load 201. When the voltage value of the electrical load 201 is lowered to a threshold value, the voltage triggering unit 2022 outputs the first control signal FC or the second control signal SC. For the example showing in this figure, the controlled discharging path 2021 is realized primarily by a metal oxide semiconductor transistor, a gate thereof is electrically coupled to a second clock signal synchronized with or related to a system clock CLK, a drain thereof is electrically coupled to the first load conductor 2011, and a source thereof is electrically coupled to a ground. A size and circuit characteristic of the metal oxide semiconductor transistor could be designed from simulating one of the four transistors coupling to ground in the latch unit 10 in FIG. 1. The voltage triggering unit 2022 could be realized by the NOT gate shown in this figure, an input terminal thereof is serially connected to the first load conductor 2011 and an output terminal thereof outputs the control signal.

Therefore, when the controlled discharging path 2021 is triggered by the second clock signal synchronized with or related to the system clock CLK so that it is turned on, the electrical load 201 is discharged from the first level range (high voltage level in this embodiment) to a voltage level low enough to trigger the NOT gate to output the control signal having high level to following circuit. Because the first load conductor 2011 is electrically coupled to the second load conductor 2012 when the voltage values of the first port word line and the second port word line of the same word line set are both within the first level range so as to change the load value of the electrical load 201 from the first load value with smaller value to the second load value with larger value, and, on the other hand, the first load conductor 2011 is kept to be disconnected from the second load conductor 2012 when the voltage values of the first port word line and the second port word line of the same word line set are not both within the first level range so that the load value of the electrical load 201 is maintained at the first load value having smaller value. Therefore, a discharging duration of a larger load is longer so that the second control signal SC is outputted later, and, on the other hand, the discharging duration of a smaller load is shorter so that the first control signal FC is outputted earlier.

The control signal above is outputted to the clock signal generator 21 for reference and adjusting the duration (or pulse width) of the first clock signal kept within the first level range sent to the word line set, such as switching the first clock signal from the first level range to the second level range, for example, from high level to low level, in response to triggering of the first control signal FC or second control signal SC, so that when the load value is larger, the second control signal SC outputted later would result in a longer duration of the first clock signal kept in high level on the word line, and, when the load value is smaller, the first control signal FC outputted earlier would result in a shorter duration of the first clock signal kept in high level on the word line. Accordingly, the pulse width can be modulated effectively and power saving can be realized.

Besides, the control signals described above can be transmitted to the bit line data sensing device 29, such as a sense amplifier usually found in a memory device, shown in FIG. 2D. The bit line data sensing device 29 is electrically coupled to the control signal generator 202 of the status detecting device 20 and a bit line set (not shown in this figure) of the random access memory. The bit line data sensing device 29 is enabled in response to triggering of the control signal so as to reduce the duration of the bit line kept at a first voltage value in the random access memory, and therefore the power consumption can be reduced as well so as to save power.

Figure 3:
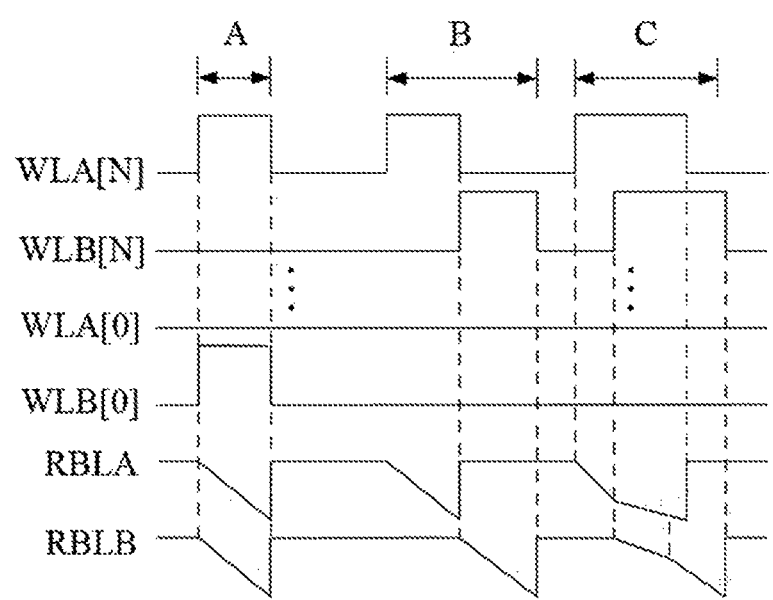
FIG. 3 is a schematic waveform diagram of an embodiment of a pulse width modulation device during operation in the present application.

Please refer to the schematic waveform diagram shown in FIG. 3 for clear explanation, a schematic waveform diagram of the first port word lines WLA[N], . . . WLA[0] and the second port word lines WLB[N], . . . , WLB[0] in the embodiments under three different statuses after using the pulse width modulation device of the present application is illustrated. During the time period of a status A, the word lines in different word line sets are simultaneously changed from a second voltage value to the first voltage value, such as the voltage values of the signals on WLA[N] and WLB[0] being changed from low level to high level simultaneously, and data reading operations or data writing operations are prepared to be performed on the bit lines of two corresponded static random access memory units (not shown in this figure). However, the status A does not match the condition that the voltage values of the first port word line and the second port word line of the same word line set are within the first level range, so that the load value of the electrical load 201 is maintained at the first load value.

During the time period of a status B, the voltage values of the first port word line and the second port word line of the same word line set are changed from the second voltage value to the first voltage value at different time, such as the voltage values of the signals on WLA[N] and WLB[N] being changed from the low level to the high level in a sequence non-overlapped, and data reading operations or data writing operations are prepared to be performed on two bit lines of a corresponded static random access memory unit (not shown in this figure). However, the status B does not match the condition that the voltage values of the first port word line and the second port word line of the same word line set are within the first level range, so that the load value of the electrical load 201 is maintained at the first load value.

During the time period of a status C, the voltage values of the first port word line and the second port word line of the same word line set are changed from the second voltage value to the first voltage value, for example, there being an overlapped duration of the voltage values of the signals on WLA[N] and WLB[N] both kept at the high level, and data reading operations or data writing operations are prepared to be performed on two bit lines of a corresponded static random access memory unit (not shown in this figure). Because the status C matches the condition that the voltage values of the first port word line and the second port word line of the same word line set are within the first level range, so that the load value of the electrical load 201 is switched to the second load value in the overlapped duration of the voltage values of the signals on WLA[N] and WLB[N] both kept at the high level. The clock signal generator 21 lengthens the duration of the clock signal kept within the first level range (high level in this embodiment) in response to the situation of slower discharging speed caused by the second load value and further in accordance with the control signal generated slower, and outputs the clock signal to the word line set so as to meet the slow speed situation caused by the larger load because of simultaneously charging/discharging two bit lines of the corresponding one static random access memory unit (not shown in this figure). The waveform of charging/discharging operation thereof could be referred to the illustrated waveform of the first load conductor RBLA and the third load conductor RBLB in this figure.

Accordingly, because the overlapped duration of simultaneously charging/discharging two bit lines is existed in the status C, the load value is larger. At this time, the clock signal generator 21 generates and outputs the clock signal to the word line set in accordance with the load value of the electrical load 201, and the length of the duration of the clock signal kept within the first level range (high level in this embodiment) can be set as a longer time period as shown in this figure to meet the situation of slow charging/discharging speed on bit lines. However, because there's no need to charge/discharge two bit lines simultaneously in the status A and status B, the load value is smaller. At this time, the clock signal generator 21 generates and outputs the clock signal to the word line set in accordance with the load value of the electrical load 201, so that the length of the duration of the clock signal kept within the first level range (high level in this embodiment) can be set as a shorter time period to avoid from consuming too much power, and the risk of data conversion or lost in the stored data due to environment noises caused by the long turn-on time of the word lines can be reduced. Therefore, the technique in the present application could improve the drawbacks of the conventional multi-port static random access memory and the reading/writing circuit thereof.

Figure 4:
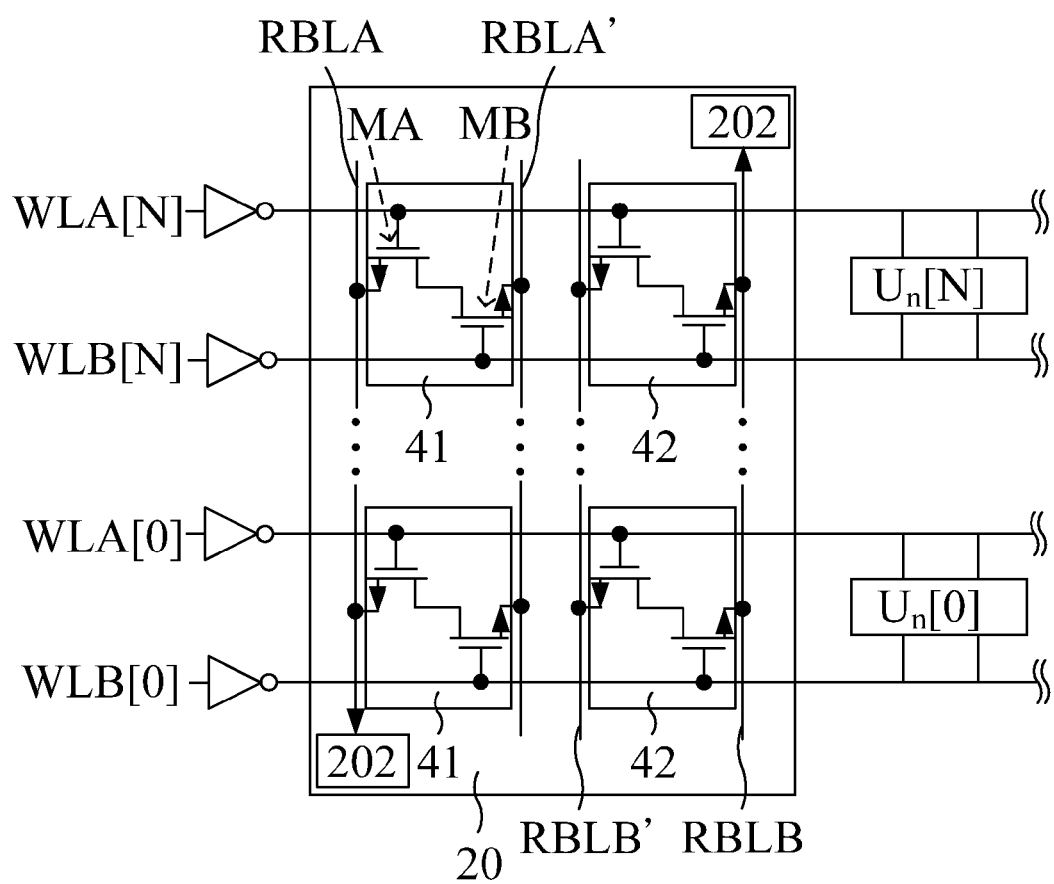
FIG. 4 is a schematic diagram of another embodiment of an electrical load with changeable load value.

Please refer to FIG. 4, a schematic diagram of another preferred embodiment of the electrical load 201 with changeable load value described above is illustrated. The electrical load 201 primarily comprises two load conductor sets and controlled switch devices. Specifically, there comprises a first load conductor RBLA, a second load conductor RBLA', a controlled switch device 41, a third load conductor RBLB, a fourth load conductor RBLB' and another controlled switch device 42. The first load conductor RBLA is electrically coupled to the clock signal generator 21, and the controlled switch device 41 is electrically coupled to the first port word lines WLA[N], . . . , WLA[0], the second port word lines WLB[N], . . . , WLB[0], the first load conductor RBLA and the second load conductor RBLA', switches to electrically connect the first load conductor RBLA to the second load conductor RBLA' when the voltage values of the first port word line and the second port word line of one word line set are both within the first level range (high level in this embodiment) so as to change the load value of the electrical load 201 to the second load value from the first load value, and, on the other hand, switches to disconnect the first load conductor RBLA from the second load conductor RBLA' when the voltage values of the first port word line and the second port word line of each word line set are not both within the first level range so as to maintain the load value of the electrical load 201 at the first load value. Wherein, a circuit layout of the first load conductor RBLA and the second load conductor RBLA' could be similar to the bit lines BLA and BLB of the static random access memory (not shown in this figure) as far as possible so as to make the load value of the first load conductor RBLA and the second load conductor RBLA' approach to the equivalent load value of any bit line of the dual-port random access memory.

The controlled switch device 41 may comprise a first metal oxide semiconductor transistor MA and a second metal oxide semiconductor transistor MB. A gate of the first metal oxide semiconductor transistor MA is electrically coupled to the first word lines WLA[N], ... WLA[0], and a source thereof is electrically coupled to the first load conductor RBLA. A gate of the second metal oxide semiconductor transistor MB is electrically coupled to the second port word lines WLB[N], ... WLB[0], a source thereof is electrically coupled to the second load conductor RBLA', and a drain thereof is electrically coupled to a drain of the first metal oxide semiconductor transistor MA. By doing so, the operations of the controlled switch device 41 described above and the schematic waveform diagram of the first load conductor RBLA shown in FIG. 3 can be achieved and the drawbacks of the conventional technique can be improved. The control signal generator 202 electrically coupled to the electrical load 201 in FIG. 2D is electrically coupled to the first load conductor RBLA to generate a control signal corresponding to the first port word line WLA in accordance with the voltage variation of the first load conductor RBLA. Besides, the controlled switch device 42, the third load conductor RBLB and the fourth load conductor RBLB' in the electrical load 201 are disposed corresponding to the requirement of the second port word line. Accordingly, the control signal generator 202 can generate the control signal corresponding to the second port word line WLB in accordance with the voltage variation of the third load conductor RBLB. Obviously, when a word line of a third port or other ports is set, a number of control signal generators corresponding to the number of ports can be set correspondingly.

Figure 5:
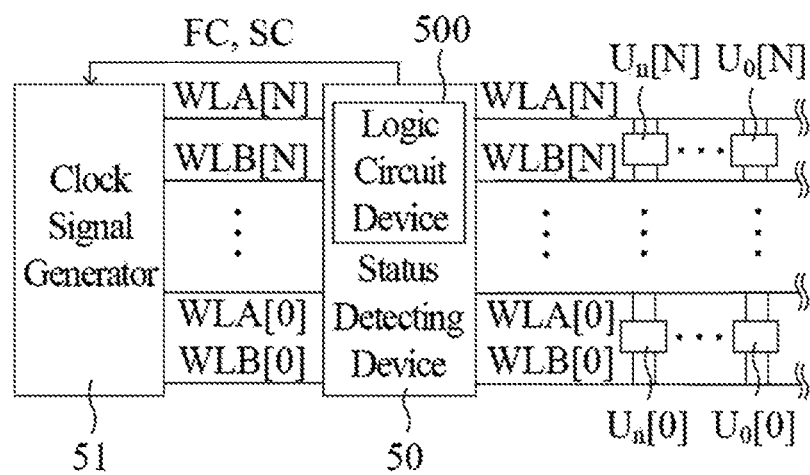
FIG. 5 is a block circuit diagram of another preferred embodiment of a pulse width modulation device developed by the present application.

Please refer to FIG. 5, which is a block circuit diagram of another preferred embodiment of a pulse width modulation device developed by the present application, the difference between this embodiment and the previous embodiment is that the status detecting device 50 accomplishes status determination by using a logic circuit device 500 instead of the electrical load 201 with changeable load value and the controlled switch device. The logic circuit device 500 outputs a first control signal FC to the clock signal generator 51 when the voltage values of the first port word lines WLA[N], ..., WLA[0] and the voltage values of the second port word lines WLB[N], ..., WLB[0] are within the first level range. The clock signal generator 51 generates and outputs a clock signal to the word line set. The duration of the clock signal kept within the first level range is changed in response to the control signal, and the waveform variation of signals are shown in FIG. 3 and therefore are not described again. The logic circuit device 500 outputs the first control signal FC to the clock signal generator when the voltage values of the first port word line and the second port word line are both within the first level range, and outputs the second control signal SC to the clock signal generator when the voltage values of the first port word line and the second port word line are not both within the first level range. The logic circuit device 500 can be accomplished by a AND gate or other similar logic gates. Besides, the present application is widely applicable to a memory unit having three or more ports by simply providing devices of which the number is related to the number of the ports. For example, in an embodiment having three ports, the logic circuit device 500 detects the situations of two ports or three ports are simultaneously within the first level range and outputs different control signals accordingly so as to change the duration of the clock signal kept within the first level range and outputs the clock signal to the word line set. The principle is that the more ports within the first level range are, the longer the duration of the clock signal kept within the first level range is. The details are not repeated again here.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A pulse width modulation device for use in an N-ports random access memory, N being greater than or equal to 2, the N-ports random access memory comprising a plurality of word line sets, at least a specified one of the word line sets comprising N port word lines, and the pulse width modulation device comprising:
    a status detecting device outputting a first control signal when both voltage values of a first port word line and a second port word line are within a first level range; and
    a clock signal generator electrically coupled to the status detecting device and the specified word line set and generating and outputting a first clock signal to the specified word line set, wherein a duration of the first clock signal kept within the first level range is variable and a pulse width of the first clock signal is adjusted by the first control signal.

2. The pulse width modulation device according to claim 1, wherein the N-ports random access memory is an N-ports static random access memory, and each of the word line sets comprises N port word lines.

3. The pulse width modulation device according to claim 1, wherein the status detecting device comprises a logic circuit device electrically coupled to the first port word line and the second port word line, outputting the first control signal to the clock signal generator when both voltage values of the first port word line and the second port word line are within the first level range, and outputting a second control signal to the clock signal generator when the voltage values of the first port word line and the second port word line are not both within the first level range.

4. The pulse width modulation device according to claim 3, wherein the logic circuit device is an AND gate, which has input terminals electrically coupled to the first port word line and the second port word line, respectively, and an output terminal from which the first or second control signal is outputted to the clock signal generator.

5. The pulse width modulation device according to claim 1, wherein the status detecting device comprises:
    an electrical load electrically coupled to the first port word line and the second port word line, and having a load value, wherein the load value is changed from a first value to a second value when both the voltage values of the first port word line and the second port word line are within the first level range; and
    a control signal generator electrically coupled to the electrical load and generating the first control signal in response to the change of the load value to the second value.

6. The pulse width modulation device according to claim 5, wherein the electrical load comprises:
    a first load conductor electrically coupled to the control signal generator;
    a second load conductor; and
    a controlled switch device electrically coupled to the first port word line, the second port word line, the first load conductor and the second load conductor, switched to electrically connect the first load conductor to the second load conductor when both the voltage values of the first port word line and the second port word line are within the first level range so as to change the load value to the second value from the first value, and switched to disconnect the first load conductor from the second load conductor when the voltage values of the first port word line and the second port word line are not both within the first level range so as to maintain the load value at the first value.

7. The pulse width modulation device according to claim 6, wherein a load value of the first load conductor or a load value of the second load conductor is substantially equal to an equivalent load value of a bit line of the N-ports random access memory.

8. The pulse width modulation device according to claim 6, wherein the controlled switch device comprises:
a first metal oxide semiconductor transistor, a gate of which is electrically coupled to the first port word line, and a source of which is electrically coupled to the first load conductor; and
a second metal oxide semiconductor transistor, a gate of which is electrically coupled to the second port word line, a source of which is electrically coupled to the second load conductor, and a drain of which is electrically coupled to a drain of the first metal oxide semiconductor transistor.

9. The pulse width modulation device according to claim 5, wherein the control signal generator comprises:
a controlled discharging path electrically coupled to the electrical load for conducting a discharging operation of the electrical load therethrough during a specific period of time so as to lower the voltage value of the electrical load; and
a voltage triggering unit electrically coupled to the electrical load, and generating the first control signal when the voltage value of the electrical load is lowered to a threshold value.

10. The pulse width modulation device according to claim 9, wherein the controlled discharging path comprises a third metal oxide semiconductor transistor, a gate of which is electrically coupled to a second clock signal, a drain of which is electrically coupled to the first load conductor, and a source of which is electrically coupled to a ground.

11. The pulse width modulation device according to claim 9, wherein the voltage triggering unit is a NOT gate, an input terminal of which is serially coupled to the first load conductor, and an output terminal of which outputs the first control signal.

12. The pulse width modulation device according to claim 5, wherein the first clock signal, which is generated by the clock signal generator and sent to the word line set, is switched to a second level range from the first level range when the clock signal generator is triggered by the first control signal.

13. The pulse width modulation device according to claim 1, wherein the first control signal outputted by the status detecting device is transmitted to a bit line data sensing device, which is electrically coupled to the status detecting device and a bit line set of the N-ports random access memory, and is enabled when triggered by the first control signal.

14. A pulse width modulation device for use in a static random access memory, the static random access memory comprising a plurality of word line sets, at least a specified one of the word line sets comprising at least a first port word line and a second port word line, and the pulse width modulation device comprising:
a status detecting device changing a basis for discharging from a first load value to a second load value when both voltage values of the first port word line and the second port word line are within a first level range; and
a clock signal generator generating and sending a first clock signal to the specified word line set, wherein a duration of the first clock signal kept within the first level range is determined in accordance with at least a discharging duration of the first load value or a discharging duration of the second load value.

15. The pulse width modulation device according to claim 14, wherein a control signal is transmitted to the clock signal generator to determine the duration of the first clock signal kept within the first level range in response to a voltage of a first load conductor of the status detecting device discharged to be equal to or lower than a threshold value.

* * * * *